United States Patent [19]

Tompkin

[11] Patent Number: 5,969,051
[45] Date of Patent: Oct. 19, 1999

[54] HYDROPHILIC NITRILE RUBBER

[75] Inventor: Gary Richard Tompkin, Copley, Ohio

[73] Assignee: The Goodyear Tire & Rubber Company, Akron, Ohio

[21] Appl. No.: 09/128,072

[22] Filed: Aug. 3, 1998

Related U.S. Application Data

[60] Provisional application No. 60/055,455, Aug. 11, 1997.

[51] Int. Cl.[6] .................................................. C08F 20/44
[52] U.S. Cl. ...................................... 525/329.1; 525/329.2; 525/329.3
[58] Field of Search ............................. 525/329.1, 329.2, 525/329.3

[56] References Cited

U.S. PATENT DOCUMENTS

| | | | |
|---|---|---|---|
| 4,446,282 | 5/1984 | Jalics | 525/327.7 |
| 5,310,815 | 5/1994 | Senyek et al. | 525/329.3 |
| 5,753,772 | 5/1998 | Laurich et al. | 525/329.3 |
| 5,859,132 | 1/1999 | Ngoc | 525/94 |

*Primary Examiner*—Edward J. Cain
*Attorney, Agent, or Firm*—Alvin T Rockhill

[57] ABSTRACT

The present invention relates to a hydrophilic nitrile rubber which is particularly useful in making photopolymer formulations for printing plates utilized in flexographic printing applications. The hydrophilic nitrile rubber of this invention is made by treating a standard carboxylated nitrile rubber with a sulfur trioxide/dimethylformamide complex. This invention more specifically discloses a process for preparing a hydrophilic nitrile rubber composition which is particularly useful in making photopolymer formulations for printing plates, said process comprising the steps of (1) reacting a carboxylated nitrile rubber with a complex of sulfur trioxide and dimethylformamide to produce a nitrile rubber containing sulfonated carboxyl groups and (2) reacting the nitrile rubber containing sulfonated carboxyl groups with a salt selected from the group consisting of sodium hydroxide and potassium hydroxide to produce the hydrophilic nitrile rubber.

25 Claims, No Drawings

HYDROPHILIC NITRILE RUBBER

This application claims the benefit of U.S. Provisional application Ser. No. 60/055,455 filed Aug. 11, 1997.

BACKGROUND OF THE INVENTION

It is critical for photopolymer composition utilized in making printing plates to exhibit a high degree of water swell which allows for easy scrub-off of that part of the printing plate which was not cured. In other words, it is important for the rubbery polymer employed in making the printing plate to be hydrophilic in nature. It is also highly desirable for the photopolymer compositions utilized in making printing plates to have a high degree of clarity so that ultra-violet light which is transmitted through a photographic negative can penetrate the composition and initiate cure. There are also certain mechanical requirements needed from such photopolymer compositions.

U.S. Pat. No. 4,045,231 discloses the utilization of polystyrene-polybutadiene-polystyrene triblock polymers in printing plates. U.S. Pat. No. 4,162,919 discloses the employment of styrene-isoprene diblock polymers and styrene-isoprene diblock polymers in flexographic printing plates. U.S. Pat. No. 5,344,743 discloses flexographic photosensitive printing plates which are made with formulations comprising triblock polymers of poly(vinylpyridine)-poly (butadiene) or poly(isoprene)-poly(vinylpyridine).

Certain carboxylated nitrile rubbers, such as Chemigum® NX775 carboxylated nitrile rubber which is sold by The Goodyear Tire & Rubber Company, offer most of the physical requirements needed from a base polymer for printing plate photopolymer compositions. However, such carboxylated nitrile rubbers do not have adequate clarity and are too water-resistant for utilization in such applications. It is also important for carboxylated nitrile rubbers utilized in such applications to have a Mooney ML-4 viscosity of less than about 80.

Except for their inadequate clarity and water swell characteristics, the carboxylated nitrile rubbers disclosed by U.S. Pat. Nos. 4,415,690, 4,435,535 and 4,452,936 would be suitable for utilization in making printing plate photopolymer compositions. U.S. Pat. No. 4,415,690 discloses the utilization of succinic anhydride derivatives as scorch inhibiting agents. U.S. Pat. No. 4,435,535 discloses the utilization of adipic acid as a scorch inhibiting agent and U.S. Pat. No. 4,452,936 discloses the utilization of oligomerized fatty acids as scorch inhibiting agents.

United States patent application Ser. No. 08/766,449 pending, discloses a carboxylated nitrile rubber which is suitable for utilization as a base polymer for printing plate photopolymer compositions. The level of methacrylic acid incorporated into this rubber is increased so as to be within the range of about 10 weight percent to about 20 weight percent to increase water swell. Ser. No. 08/766,449 pending also reports that it is critical for the coagulation process carried out in recovering the carboxylated nitrile rubber from the latex to be accomplished without utilizing polyelectrolytes, such as Nalco™ 108 polyelectrolyte, as coagulation aids. The utilization of at least one organic acid which contains at least three carboxyl groups, such as citric acid, in the carboxylated nitrile rubbers is also reported as being critical.

United States patent application Ser. No. 08/766,449 pending more specifically discloses a high clarity water-sensitive carboxylated nitrile rubber composition which is comprised of (a) a carboxylated nitrile rubber which is comprised of repeat units which are derived from about 30 weight percent to about 60 weight percent 1,3-butadiene, from about 30 weight percent to about 50 weight percent acrylonitrile and from about 10 weight percent to about 20 weight percent methacrylic acid and (b) from about 1 to about 10 phr of at least one organic acid which contains at least three carboxyl groups. The carboxylated nitrile rubber of Ser. No. 08/766,449 pending is reported to typically have a Mooney ML-4 viscosity of less than about 80.

SUMMARY OF THE INVENTION

By utilizing the technique of this invention, standard carboxylated nitrile rubbers that contain no more than about 10 weight percent methacrylic acid can be modified so as to be made to be hydrophilic in nature. These hydrophilic nitrile rubbers are suitable for utilization as base polymers for printing plate photopolymer compositions. It is preferred for the carboxylated nitrile rubber which is modified using the technique of this invention to be of high clarity. It is accordingly preferred for the carboxylated nitrile rubber employed to be coagulated without utilizing polyelectrolytes. It is also beneficial for the carboxylated nitrile rubber to contain an organic acid which contains at least three carboxyl groups, such as citric acid, which can be added before coagulation or to the dry rubber after coagulation.

The present invention more specifically reveals a process for preparing a hydrophilic nitrile rubber composition which is particularly useful in making photopolymer formulations for printing plates, said process comprising the steps of (1) reacting a carboxylated nitrile rubber with a complex of sulfur trioxide and dimethylformamide to produce a nitrile rubber containing sulfonated carboxyl groups and (2) reacting the nitrile rubber containing sulfonated carboxyl groups with a salt selected from the group consisting of sodium hydroxide and potassium hydroxide to produce the hydrophilic nitrile rubber.

The subject invention also discloses a hydrophilic nitrile rubber composition which is particularly useful in making photopolymer formulations for printing plates, said hydrophilic nitrile rubber composition being comprised of polymer chains represented by the structural formula:

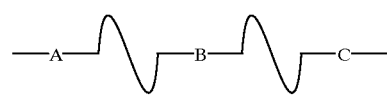

wherein A represents repeat units of the formula:

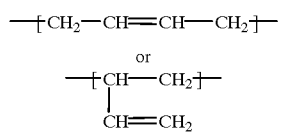

wherein B represents repeat units of the formula:

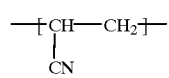

wherein C represents repeat units of the formula:

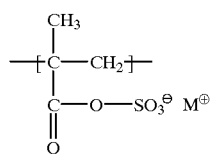

wherein from about 45 weight percent to about 80 weight percent of the repeat units in the polymer are represented by A; wherein from about 15 weight percent to about 45 weight percent of the repeat units in the polymer are represented by B; wherein from about 1 weight percent to about 10 weight percent of the repeat units in the polymer are represented by C; wherein $\sim\!\!\sqrt{}\!\!\sim$ indicated that the repeat units can be distributed in any order; and wherein M represents a metal selected from the group consisting of sodium and potassium.

The present invention further reveals a water-washable photopolymer composition which is comprised of: (1) a hydrophilic nitrile rubber composition which is comprised of polymer chains represented by the structural formula:

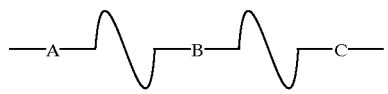

wherein A represents repeat units of the formula:

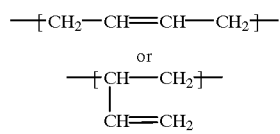

wherein B represents repeat units of the formula:

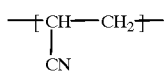

wherein C represents repeat units of the formula:

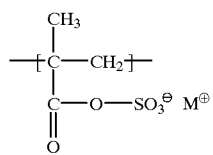

wherein from about 45 weight percent to about 80 weight percent of the repeat units in the polymer are represented by A; wherein from about 15 weight percent to about 45 weight percent of the repeat units in the polymer are represented by B; wherein from about 1 weight percent to about 10 weight percent of the repeat units in the polymer are represented by C; wherein $\sim\!\!\sqrt{}\!\!\sim$ indicated that the repeat units can be distributed in any order; and wherein M represented a metal selected from the group consisting of sodium and potassium; (2) a crosslinking agent; and (3) a photoinitiator. Said water-washable photopolymer compositions are preferably further comprised of (4) a swell enhancing filler; (5) a plasticizer; (6) a compatibilizer; and (7) a surfactant.

DETAILED DESCRIPTION OF THE INVENTION

Carboxylated nitrile rubbers contain repeat units which are derived from 1,3-butadiene, acrylonitrile and methacrylic acid. They can be synthesized by the free radical terpolymerization of the 1,3-butadiene, acrylonitrile and methacrylic acid monomers under emulsion polymerization conditions. Such emulsion polymerizations generally utilize a charge composition which is comprised of water, the monomers, an initiator and an emulsifier (soap). Emulsion polymerizations of this type can be conducted over a very wide temperature range from about 0° C. to as high as about 100° C. It is normally preferred for emulsion polymerizations of this type to be carried out at a temperature which is within the range of about 5° C. to about 60° C. It is generally more preferred for the emulsion polymerization to be conducted at a temperature which is within the range of about 15° C. to about 30° C.

In the synthesis of carboxylated nitrile rubbers, the ratio of monomers utilized in the charge composition can vary. However, the monomer charge composition will normally contain from about 45 to about 80 weight percent 1,3-butadiene, from about 15 to about 45 weight percent acrylonitrile and from about 1 to about 10 weight percent methacrylic acid. The monomer charge composition will more typically contain from about 60 to about 75 weight percent 1,3-butadiene, from about 20 to about 35 weight percent acrylonitrile and from about 4 to about 9 weight percent methacrylic acid. The monomer charge composition will preferably contain from about 64 to about 70 weight percent 1,3-butadiene, from about 22 to about 30 weight percent acrylonitrile and from about 6 to about 8 weight percent methacrylic acid.

The charge composition used in the preparation of the carboxylated nitrile rubber latex will contain a substantial quantity of water. The ratio between the total amount of monomers present in the charge composition and water can range between about 0.2:1 and about 1.2:1. It is generally preferred for the ratio of monomers to water in the charge composition to be within the range of about 0.8:1 and about 1.1:1. For instance, it is very satisfactory to utilize a ratio of monomers to water in the charge composition of about 1:1.

The charge composition will also normally contain from about 0.5 phm (parts per hundred parts by weight of monomer) to about 6 phm of at least one emulsifier. It is normally preferred for the emulsifier to be present in the polymerization medium at a level within the range of about 1 phm to about 5 phm. It is generally more preferred for the charge composition to contain from about 2 to about 4 phm of the emulsifier.

The emulsifiers used in the polymerization may be charged at the outset of the polymerization or may be added incrementally or by proportioning as the reaction proceeds. Generally, anionic emulsifier systems provide good results; however, any of the general types of anionic, cationic or nonionic emulsifiers may be employed in the polymerization.

Among the anionic emulsifiers that can be employed in the emulsion polymerization are fatty acids and their alkali metal soaps such as caprylic acid, capric acid, pelargonic acid, lauric acid, undecylic acid, myristic acid, palmitic acid, margaric acid, stearic acid, arachidic acid, and the like; amine soaps of fatty acids such as those formed from ammonia, mono- and dialkyl amines, substituted hydrazines, guanidine and various low molecular weight diamines; chain-substituted derivatives of fatty acids such as those having alkyl substituents; naphthenic acids and their soaps and the like; sulfuric esters and their salts, such as the tallow alcohol sulfates, coconut alcohol sulfates, fatty alcohol sulfates, such as oleyl sulfate, sodium lauryl sulfate and the like; sterol sulfates; sulfates of alkylcyclohexanols, sulfation products of lower polymers of ethylene as $C_{10}$ to $C_{20}$ straight chain olefins and other hydrocarbon mixtures, sulfuric esters of aliphatic and aromatic alcohols having intermediate linkages, such as ether, ester or amide groups such as alkylbenzyl (polyethyleneoxy) alcohols, the sodium salt of tridecyl ether sulfate; alkane sulfonates, esters and salts, such as alkylchlorosulfonates with the general formula $RSO_2Cl$, wherein R is an alkyl group having from 10 to 20 carbon atoms and alkylsulfonates with the general formula $RSO_2$—OH, wherein R is an alkyl group having from 1 to 20 carbon atoms; sulfonates with intermediate linkages such as ester and ester-linked sulfonates such as those having the formula $RCOOC_2H_4SO_3H$ and $ROOC$—$CH_2$—$SO_3H$, wherein R is an alkyl group having from 1 to 20 carbon atoms such as dialkyl sulfosuccinates; ester salts with the general formula:

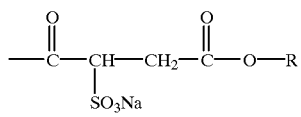

wherein R is an alkyl group having from 1 to 20 carbon atoms; alkaryl sulfonates in which the alkyl groups contain preferably from 10 to 20 carbon atoms, e.g. dodecylbenzenesulfonates, such as sodium dodecylbenzenesulfonates; alkyl phenol sulfonates; sulfonic acids and their salts such as acids with the formula $RSO_3Na$, wherein R is an alkyl and the like; sulfonamides; sulfamido methylenesulfonic acids; rosin acids and their soaps; sulfonates derivatives of rosin and rosin oil; and lignin sulfonates and the like.

Rosin acid soap has been used with good success at a concentration of about 5 percent by weight in the initial charge composition used in the synthesis of carboxylated elastomers. Of rosin acid, about 90 percent are isometric with abietic acid and the other 10 percent is a mixture of dehydro abietic acid and dihydro abietic acid.

The polymerization may be initiated using free radical catalysts, ultraviolet light or radiation. To ensure a satisfactory polymerization rate, uniformity and a controllable polymerization, free radical initiators are generally used. Free radical initiators which are commonly used include the various peroxygen compounds such as potassium persulfate, ammonium persulfate, benzoyl peroxide, hydrogen peroxide, di-t-butyl peroxide, dicumyl peroxide, 2,4-dichlorobenzyl peroxide, decanolyl peroxide, lauroyl peroxide, cumene hydroperoxide, p-menthane hydroperoxide, t-butylhydroperoxide, acetyl acetone peroxide, methyl ethyl ketone peroxide, succinic acid peroxide, dicetyl peroxydicarbonate, t-butyl peroxyacetate, t-butyl peroxymaleic acid, t-butyl peroxybenzoate, acetyl cyclohexyl sulfonyl peroxide and the like; the various azo compounds such as 2-t-butylazo-2-cyanopropane, dimethyl azodiisobutyrate, azodiisobutyronitrile, 2-t-butylazo-1-cyanocyclohexane, 1-t-amylazo-1-cyanocyclohexane and the like; the various alkyl perketals, such as 2,2-bis-(t-butylperoxy)butane, ethyl 3,3-bis(t-butylperoxy)butyrate, 1,1-di-(t-butyl-peroxy) cyclohexane and the like. Cumene hydroperoxide is a highly preferred initiator.

After the desired degree of monomer conversion has been attained, a conventional shortstopping agent, such as hydroquinone, can be added to the polymerization medium to end the polymerization. The polymerization will typically be allowed to continue until a high level conversion has been achieved. In most cases, the monomer conversion reached will be at least about 75 percent with monomer conversions of at least about 80 percent being preferred.

After the polymerization has been completed, the latex can be coagulated. To attain a high level of clarity, the coagulation is preferably accomplished by adding to the latex at least one strong inorganic acid, calcium chloride and at least one organic acid which contains at least three carboxyl groups. The strong inorganic acid will typically be sulfuric acid and the organic acid will typically be citric acid. The calcium chloride will normally be added in an amount which is within the range of about 13 phr to about 40 phr.

The organic acid will normally be added to the latex in an amount whereby from about 1 phr to about 10 phr of the organic acid will be present in the dry carboxylated nitrile rubber after coagulation. However, the organic acid can be added in whole or in part to the dry carboxylated nitrile rubber (after coagulation) to realize the desired quantity of the organic acid in the dry rubber. As a general rule, it is preferred for about 1.5 phr to about 5 phr of the organic acid to be present in the carboxylated nitrile rubber. It is normally more preferred for about 2 phr to about 4 phr of the organic acid to be present in the carboxylated nitrile rubber.

After coagulation, washing can be employed to remove excess soap and/or electrolyte from the carboxylated nitrile rubber. Sometimes washing is also useful in adjusting the pH of the carboxylated elastomer that has been synthesized and recovered from the latex. After washing, the carboxylated nitrile rubber will normally be dewatered using conventional techniques. It is then dried by employing standard procedures, such as passing warm dry air through it. After being dried, it can be utilized as a base polymer in making photopolymer formulations for printing plates utilized in flexographic printing applications.

The ratio of bound monomers in the carboxylated nitrile rubber can vary from the monomer charge ratios utilized in the synthesis of the polymer due to differences in the polymerization rates of the monomers. Thus, the carboxylated nitrile rubber can have a different ratio of repeat units which are derived from the various monomers than was utilized in the monomer charge. In any case, the carboxylated nitrile rubbers of this invention will typically have repeat units which are derived from about 45 weight percent to about 80 weight percent 1,3-butadiene monomer, from about 15 weight percent to about 45 weight percent acrylonitrile monomer and from about 1 weight percent to about 10 weight percent methacrylic acid. The carboxylated nitrile rubbers of this invention will more typically have repeat units which are derived from about 60 weight percent to about 75 weight percent 1,3-butadiene monomer, from about 20 weight percent to about 35 weight percent acrylonitrile monomer and from about 4 weight percent to about 9 weight percent methacrylic acid. The carboxylated nitrile rubbers of this invention will preferably have repeat units which are derived from about 64 weight percent to about 70 weight percent 1,3-butadiene monomer, from about 22 weight percent to about 30 weight percent acrylonitrile monomer and from about 6 weight percent to about 8 weight percent methacrylic acid.

In the first step of the process of this invention, the carboxylated nitrile rubber is reacted with a complex of sulfur trioxide and dimethylformamide ($DMF.SO_3$). This reaction is typically carried out in an organic solvent. Dimethylformamide has proven to be an excellent choice as the solvent. For instance, the carboxylated nitrile rubber can be dissolved in dimethylformamide and then a stoichiometric amount of the sulfur trioxide/dimethylformamide complex can be added to the solution to react with the carboxyl groups in the carboxylated nitrile rubber. In this reaction, the carboxyl groups on the carboxylated nitrile rubber are sulfonated as follows:

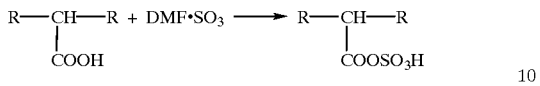

wherein R represents the polymer chains in the nitrile rubber. After this reaction, the nitrile rubber, of course, contains sulfonated carboxyl groups.

The sulfur trioxide/dimethylformamide complex can be made by simply mixing liquid sulfur trioxide into N,N-dimethylformamide at a temperature which is within the range of about 40° C. to 50° C. The complex of sulfur trioxide and N,N-dimethylformamide precipitates from the excess N,N-dimethylformamide and can be recovered by decanting the excess N,N-dimethylformamide.

The sulfur trioxide used is typically of the γ-form and will be in the liquid state. The γ-form of sulfur trioxide (γ-SO₃) is readily available from commercial sources and is sold under the tradename Sulfan. The liquid γ-SO₃ typically contains a stabilizer to prevent polymerization to the higher melting α-form and β-form. The sulfur trioxide should not be exposed to water or moisture in air. This is because it absorbs water rapidly emitting dense white fumes. In fact, sulfur trioxide can react with water with explosive violence (heat of dilution of 504 calories per gram) forming sulfuric acid.

N,N-dimethylformamide (DMF) can be synthesized by utilizing the procedure described in U.S. Pat. Nos. 3,015,674 or 3,072,725. It is a colorless very slightly yellow liquid having a faint amine odor and a melting point of −61° C. It is also readily commercially available.

In the second step of the process of this invention, the nitrile rubber containing sulfonated carboxyl groups is reacted with sodium hydroxide or potassium hydroxide. This is done by simply adding alcoholic potassium hydroxide or alcoholic sodium hydroxide to the intermediate solution containing the nitrile rubber with sulfonated carboxyl groups. It is, of course, important to add at least a stoichiometric amount of the potassium hydroxide or sodium hydroxide. This reaction can be depicted as follows:

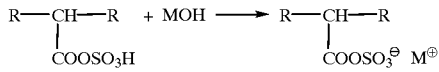

wherein R represents the polymer chains in the nitrile rubber and wherein M represents sodium or potassium. This reaction converts the sulfonated carboxyl groups on the nitrile rubber into sodium or potassium salts and makes the nitrile rubber hydrophilic.

After the sulfonated carboxyl groups on the intermediate have been converted to salts, the hydrophilic nitrile rubber can be coagulated from the solution. This can be accomplished by the addition of a lower alcohol, such as methanol or ethanol to the solution of the hydrophilic nitrile rubber. The hydrophilic nitrile rubber can then be utilized in making photopolymer formulations for printing plates utilized in flexographic printing applications. These hydrophilic nitrile rubbers will preferably have a volume swell of greater than 60 percent and will more preferably have a volume swell of greater than 70 percent. Volume swell can be determined using the following test procedure.

% Volume Swell Test

The percent volume swell test is performed as follows:
1. Cut the polymer or composition into a piece weighing approximately 1.0–1.5 g
2. Weigh sample in air ($Wa_1$)
3. Weigh sample in water ($Ww_1$)
4. Place sample in the test solution for a given time and temperature. The results reported herein were for samples placed in water for 22 hours at 60° C. unless otherwise indicated.
5. Remove sample from test solution
6. Pat sample dry
7. Reweigh sample in air ($Ww_2$)
8. Reweigh sample in water ($Ww_2$)
9. Calculate % volume swell via equation 1
   $Wa_1 - Ww_1 =$ Volume 1
   $Wa_2 - Ww_2 =$ Volume 2

$$100 \times \frac{\text{Vol.2} - \text{Vol.1}}{\text{Vol}_1} = \% \text{ Vol. swell}$$

The hydrophilic nitrile rubber made by this technique is comprised of polymer chains which can be represented by the structural formula:

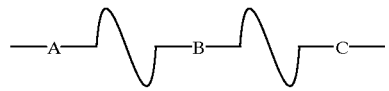

wherein A represents repeat units which are derived from 1,3-butadiene monomer and which are 1,4-repeat units of the formula:

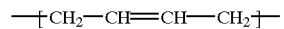

or 1,2-repeat units of the formula:

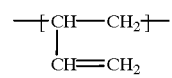

wherein B represents repeat units which are derived from acrylonitrile and which are of the formula:

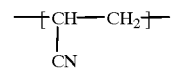

wherein C represents repeat units which are derived from acrylonitrile and which are of the formula:

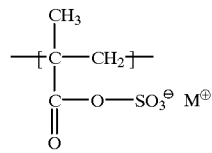

wherein from about 45 weight percent to about 80 weight percent of the repeat units in the polymer are represented by A; wherein from about 15 weight percent to about 45 weight percent of the repeat units in the polymer are represented by B; wherein from about 1 weight percent to about 10 weight percent of the repeat units in the polymer are represented by C; wherein —⋀— indicated that the repeat units can be distributed in any order; and wherein M represents a metal selected from the group consisting of sodium and potassium.

Water-washable photopolymer compositions can be prepared by mixing about 100 parts by weight of the hydrophilic nitrile rubber with about 15 parts by weight of a cross-linking agent, such as Sartomer SR-9035 ethoxylated triacrylate; about 2 parts by weight of a photoinitiator, such as Sartomer KB-1 benzyl dimethylketal; about 15 parts by weight of a swell enhancing filler, such as Union Carbide Polyox™ N-10 polyethylene oxide; about 15 parts by weight of a plasticizer, such as Dow Polyethyleneglycol E 400; about 20 parts by weight of a compatibilizer, such as dipropylene glycol dibenzoate; and about 5 parts by weight of a surfactant, such as ICI-Tween 20. These components can be mixed on a two-roll steel mixing mill until a homogeneous blend is attained. A mixing time of about 20 to 30 minutes is typical using a temperature-controlled mill. After this homogeneous blend of photopolymer composition is prepared, it is made into sheets for use in making flexographic printing plates.

Sheets of the photopolymer composition are typically made by molding the photopolymer composition in a press to a desired thickness, such as 0.067 inch (1.70 mm), with a polyester support on one side and a protective slip film on the other side. The polyester support normally has a thickness of about 5 mil (0.13 mm). Upon molding, the majority of the encapsulated air is removed, yielding a clear sheet. After an initial period of time in the mold at an elevated temperature, for instance, about 10 minutes at 150° F. (66° C.), cooling water is normally circulated through the press to return the material to ambient temperature. This sheet comprised of the photopolymer composition can then be used to make a flexographic printing plate containing an image by exposing the sheet to light which is transmitted through a photographic negative.

Development or washout of the exposed sheet is performed by placing the exposed sheet in an appropriate washout unit equipped with brushes and heaters to heat the washout solution to the desired temperature. For the water-washable photopolymer composition described above, which has been formed into a plate of a given thickness, the washout can be done using a 5 percent aqueous solution of Phoenix™ which is maintained at a pH of about 11.0 and a temperature of about 60° C. A washout time of about 30 minutes will typically be employed. The washout can be performed by taking a sheet of uncured or uncrosslinked water-processable photopolymer composition and placing it in a washout unit comprising a flat plate to which the sheet is adhered and an orbital brushing surface containing brushes with 8-mil bristles in a given solution, at a set temperature. After a predetermined time, the sample is removed from the washout unit and dried.

This invention is illustrated by the following example which is merely for the purpose of illustration and is not to be regarded as limiting the scope of the invention or the manner in which it can be practiced. Unless specifically indicated otherwise, parts and percentages are given by weight.

EXAMPLE

In this experiment, a carboxylated nitrile rubber was modified so as to be hydrophilic using the technique of this invention. In the procedure used, a DMF.SO$_3$ complex was prepared by adding liquid sulfur trioxide dropwise to chilled DMF which was swirled during the time that the liquid sulfur trioxide was added. Decanting the cold saturated solution left white crystals of DMF.SO$_3$ complex which were redissolved in DMF to provide a nearly colorless solution of DMF.SO$_3$ complex.

A solution of carboxylated nitrile rubber was prepared by dissolving 100 grams of Tylac 211A carboxylated nitrile rubber into DMF. Then, 30 ml of the saturated DMF.SO$_3$ complex solution was added dropwise thereto over a period of one hour with stirring. The solution was kept in an ice bath to hold the temperature within the range of about 40° F. to 50° F. (4° C. to 10° C.). This procedure sulfonated the carboxyl groups on the nitrile rubber. Then, 50 mls of a 2N potassium hydroxide in ethanol solution was added to convert the sulfonated carboxyl groups into potassium salts. The modified nitrile rubber solution was then coagulated by pouring it into secondary-butyl alcohol. The hydrophilic nitrile rubber made was recovered as a white polymer that showed good water wettability. This is in contrast to untreated Tylac 211A carboxylated nitrile rubber which does not show good water wettability.

Variations in the present invention are possible in light of the description of it provided herein. While certain representative embodiments and details have been shown for the purpose of illustrating the subject invention, it will be apparent to those skilled in this art that various changes and modifications can be made therein without departing from the scope of the subject invention. It is, therefore, to be understood that changes can be made in the particular embodiments described which will be within the full intended scope of the invention as defined by the following appended claims.

What is claimed is:

1. A process for preparing a hydrophilic nitrile rubber composition which is particularly useful in making photopolymer formulations for printing plates, said process comprising the steps of (1) reacting a carboxylated nitrile rubber with a complex of sulfur trioxide and dimethylformamide to produce a nitrile rubber containing sulfonated carboxyl groups and (2) reacting the nitrile rubber containing sulfonated carboxyl groups with a salt selected from the group consisting of sodium hydroxide and potassium hydroxide to produce the hydrophilic nitrile rubber.

2. A hydrophilic nitrile rubber composition which is particularly useful in making photopolymer formulations for printing plates, said hydrophilic nitrile rubber composition being comprised of polymer chains represented by the structural formula:

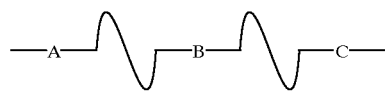

wherein A represents repeat units of the formula:

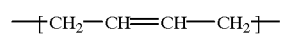

or

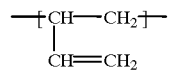

wherein B represents repeat units of the formula:

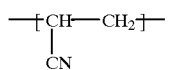

wherein C represents repeat units of the formula:

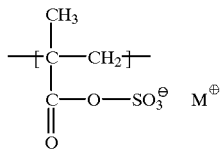

wherein from about 45 weight percent to about 80 weight percent of the repeat units in the polymer are represented by A; wherein from about 15 weight percent to about 45 weight percent of the repeat units in the polymer are represented by B; wherein from about 1 weight percent to about 10 weight percent of the repeat units in the polymer are represented by C; wherein ‑$\wedge\!\!\!\!\wedge$‑ indicated that the repeat units can be distributed in any order; and wherein M represents a metal selected from the group consisting of sodium and potassium.

3. A hydrophilic nitrile rubber composition as specified in claim 2 which is further comprised of from about 1 to about 10 phr of at least one organic acid which contains at least three carboxyl groups.

4. A hydrophilic nitrile rubber composition as specified in claim 3 wherein said organic acid which contains at least three carboxyl groups is citric acid.

5. A process as specified in claim 1 wherein said salt is potassium hydroxide.

6. A process as specified in claim 1 wherein said salt is sodium hydroxide.

7. A process as specified in claim 1 wherein said sulfur trioxide is of the γ-form and is in the liquid state.

8. A process as specified in claim 1 wherein said carboxylated nitrile rubber is comprised of repeat units which are derived from about 45 weight percent to about 80 weight percent 1,3-butadiene monomer, from about 15 weight percent to about 45 weight percent acrylonitrile monomer and from about 1 weight percent to about 10 weight percent methacrylic acid.

9. A process as specified in claim 1 wherein said carboxylated nitrile rubber is comprised of repeat units which are derived from about 60 weight percent to about 75 weight percent 1,3-butadiene monomer, from about 20 weight percent to about 35 weight percent acrylonitrile monomer and from about 4 weight percent to about 9 weight percent methacrylic acid.

10. A process as specified in claim 1 wherein said carboxylated nitrile rubber is comprised of repeat units which are derived from about 64 weight percent to about 70 weight percent 1,3-butadiene monomer, from about 22 weight percent to about 30 weight percent acrylonitrile monomer and from about 6 weight percent to about 8 weight percent methacrylic acid.

11. A water-washable photopolymer composition which is comprised of: (1) a hydrophilic nitrile rubber composition which is comprised of polymer chains represented by the structural formula:

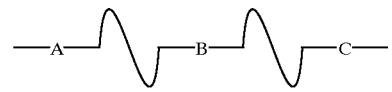

wherein A represents repeat units of the formula:

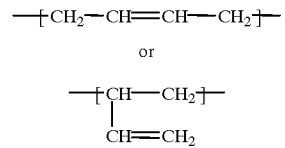

wherein B represents repeat units of the formula:

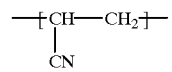

wherein C represents repeat units of the formula:

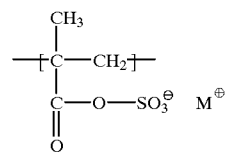

wherein from about 45 weight percent to about 80 weight percent of the repeat units in the polymer are represented by A; wherein from about 15 weight percent to about 45 weight percent of the repeat units in the polymer are represented by B; wherein from about 1 weight percent to about 10 weight percent of the repeat units in the polymer are represented by C; wherein ‑$\wedge\!\!\!\!\wedge$‑ indicated that the repeat units can be distributed in any order; and wherein M represents a member selected from the group consisting of sodium and potassium; (2) a crosslinking agent; and (3) a photoinitiator.

12. A water-washable photopolymer composition as specified in claim 11 which is further comprised of (4) a swell enhancing filler; (5) a plasticizer; (6) a compatibilizer; and (7) a surfactant.

13. A hydrophilic nitrile rubber composition as specified in claim 2 wherein from about 60 weight percent to about 75 weight percent of the repeat units in the polymer are represented by A, wherein from about 20 weight percent to about 35 weight percent of the repeat units in the polymer are represented by B and wherein from about 4 weight percent to about 9 weight percent of the repeat units in the polymer are represented by C.

14. A hydrophilic nitrile rubber composition as specified in claim 2 wherein from about 64 weight percent to about 70 weight percent of the repeat units in the polymer are represented by A, wherein from about 22 weight percent to about 30 weight percent of the repeat units in the polymer are represented by B and wherein from about 6 weight percent to about 8 weight percent of the repeat units in the polymer are represented by C.

15. A hydrophilic nitrile rubber composition as specified in claim 2 wherein M represents potassium.

16. A hydrophilic nitrile rubber composition as specified in claim 2 wherein M represents sodium.

17. A hydrophilic nitrile rubber composition as specified in claim 2 wherein said hydrophilic nitrile rubber composition has a water-swell of greater than 60 percent.

18. A hydrophilic nitrile rubber composition as specified in claim 2 wherein said hydrophilic nitrile rubber composition has a water-swell of greater than 70 percent.

19. A process for preparing a hydrophilic nitrile rubber composition which is particularly useful in making photopolymer formulations for printing plates, said process comprising the steps of (1) reacting a carboxylated nitrile rubber with a complex of sulfur trioxide and dimethylformamide to produce a sulfonated nitrile rubber intermediate and (2) reacting the sulfonated nitrile rubber intermediate with a salt selected from the group consisting of sodium hydroxide and potassium hydroxide to produce the hydrophilic nitrile rubber.

20. A process as specified in claim 19 wherein said salt is potassium hydroxide.

21. A process as specified in claim 19 wherein said salt is sodium hydroxide.

22. A process as specified in claim 19 wherein said sulfur trioxide is of the γ-form and is in the liquid state.

23. A process as specified in claim 19 wherein said carboxylated nitrile rubber is comprised of repeat units which are derived from about 45 weight percent to about 80 weight percent 1,3-butadiene monomer, from about 15 weight percent to about 45 weight percent acrylonitrile monomer and from about 1 weight percent to about 10 weight percent methacrylic acid.

24. A process as specified in claim 19 wherein said carboxylated nitrile rubber is comprised of repeat units which are derived from about 60 weight percent to about 75 weight percent 1,3-butadiene monomer, from about 20 weight percent to about 35 weight percent acrylonitrile monomer and from about 4 weight percent to about 9 weight percent methacrylic acid.

25. A process as specified in claim 19 wherein said carboxylated nitrile rubber is comprised of repeat units which are derived from about 64 weight percent to about 70 weight percent 1,3-butadiene monomer, from about 22 weight percent to about 30 weight percent acrylonitrile monomer and from about 6 weight percent to about 8 weight percent methacrylic acid.

* * * * *